(12) United States Patent
Jang et al.

(10) Patent No.: US 8,704,972 B2
(45) Date of Patent: Apr. 22, 2014

(54) CONNECTOR FOR LIGHT SOURCE MODULE AND BACKLIGHT ASSEMBLY HAVING THE SAME

(75) Inventors: Jin-Won Jang, Asan-si (KR); Moon-Shik Kang, Yongin-si (KR); Young-Sup Kwon, Gwangmyeong-si (KR); Min-Soo Choi, Asan-si (KR); Seung-Wan Kim, Asan-si (KR)

(73) Assignee: Samsung Display Co., Ltd. (KR)

( * ) Notice: Subject to any disclaimer, the term of this patent is extended or adjusted under 35 U.S.C. 154(b) by 200 days.

(21) Appl. No.: 13/181,555

(22) Filed: Jul. 13, 2011

(65) Prior Publication Data

US 2012/0146543 A1 Jun. 14, 2012

(30) Foreign Application Priority Data

Dec. 8, 2010 (KR) .................... 10-2010-0124669

(51) Int. Cl.
*G02F 1/1335* (2006.01)
(52) U.S. Cl.
USPC ............... 349/61; 349/58; 349/64; 349/65
(58) Field of Classification Search
None
See application file for complete search history.

(56) References Cited

U.S. PATENT DOCUMENTS

| | | | |
|---|---|---|---|
| 2009/0046462 A1* | 2/2009 | Park et al. | 362/249 |
| 2009/0190060 A1 | 7/2009 | Choi | |
| 2009/0273726 A1* | 11/2009 | Choi | 349/58 |
| 2010/0123848 A1* | 5/2010 | Kang et al. | 349/58 |
| 2010/0157194 A1* | 6/2010 | Kim | 349/61 |

FOREIGN PATENT DOCUMENTS

| | | |
|---|---|---|
| EP | 2026427 A2 | 2/2009 |
| KR | 20100109174 A | 10/2010 |
| WO | 2011086799 A1 | 7/2011 |

OTHER PUBLICATIONS

EP Search Report dated Feb. 23, 2012 from EP Application No. 11178077.1.

* cited by examiner

*Primary Examiner* — Thanh-Nhan P Nguyen
(74) *Attorney, Agent, or Firm* — Cantor Colburn LLP

(57) ABSTRACT

A connector for a light source module includes a body portion and a terminal portion. The body portion includes a first opening portion and a second opening portion. The first opening portion receives a portion of the light source module. The second opening portion receives a portion of a light source driver which drives the light source module. The terminal portion includes a first terminal and a second terminal. The first terminal is in the first opening portion of the body portion. The second terminal is connected to the first terminal. The second terminal is in the second opening portion of the body portion.

30 Claims, 10 Drawing Sheets

US 8,704,972 B2

CONNECTOR FOR LIGHT SOURCE MODULE AND BACKLIGHT ASSEMBLY HAVING THE SAME

This application claims priority to Korean Patent Application No. 2010-124669, filed on Dec. 8, 2010, and all the benefits accruing therefrom under 35 U.S.C. §119, the contents of which are herein incorporated by reference in their entireties.

BACKGROUND OF THE INVENTION

1. Field of the Invention

Exemplary embodiments of the present invention relate to a connector for a light source module and a backlight assembly having the connector. More particularly, exemplary embodiments of the present invention relate to a connector for a light source module capable of simplifying a connecting structure, decreasing a manufacturing cost and improving reliability, and a backlight assembly having the connector.

2. Description of the Related Art

Generally, a liquid crystal display apparatus has a thin thickness, a light weight, and a low power consumption so that the liquid crystal display apparatus has been broadly used for a monitor, a laptop computer, a cellular phone, a television and so on. The liquid crystal display apparatus includes a liquid crystal display panel displaying images using a light transmittance of a liquid crystal, and a backlight assembly disposed under the liquid crystal display panel to provide a light to the liquid crystal display panel.

The backlight assembly includes a plurality of light sources generating light required to display the images by the liquid crystal display panel. For example, the light sources may include a cold cathode fluorescent lamp ("CCFL"), an external electrode fluorescent lamp ("EEFL"), a flat fluorescent lamp ("FFL"), and a light emitting diode ("LED"), etc.

The LED having a low power consumption and not causing pollution has been being broadly used. The backlight assembly may include a plurality of LED modules and a driving circuit part driving the LED modules. Generally, the driving circuit part is disposed on an outside of a bottom chassis.

A connector and connecting wirings are used to connect an input terminal of the LED module to an output terminal of the driving circuit part. Assembly processes may be complicated due to the connecting wirings. A manufacturing cost may be increased due to fixing elements, such as a tape and a fixing structure, to fix the connecting wirings to the backlight assembly. An electrical interference may be caused between the connecting wirings. A sheath of the connecting wiring may be peeled off when contacting the fixing structure. Therefore, reliability of the backlight assembly and the liquid crystal display apparatus may be decreased, and a fire may be caused.

BRIEF SUMMARY OF THE INVENTION

Exemplary embodiments of the present invention provide a connector for light source module capable of simplifying a connecting structure, decreasing a manufacturing cost and improving reliability.

Exemplary embodiments of the present invention also provide a backlight assembly including the connector.

In an exemplary embodiment according to the present invention, a connector for a light source module includes a body portion and a terminal portion. The body portion includes a first opening portion and a second opening portion. The first opening portion receives a portion of the light source module. The second opening portion receives a portion of a light source driver which drives the light source module. The terminal portion includes a first terminal and a second terminal. The first terminal is in the first opening portion. The second terminal is connected to the first terminal. The second terminal is in the second opening portion.

In an exemplary embodiment, the first opening portion may extend through an upper surface of the body portion. The second opening portion may extend through a side surface of the body portion substantially perpendicular to the upper surface of the body portion.

In an exemplary embodiment, the first opening portion may include a first opening and a second opening.

In an exemplary embodiment, the first opening portion may extend through a first side surface of the body portion. The second opening portion may extend through a second side surface of the body portion substantially perpendicular to the side surface through which the first opening portion is extended.

In an exemplary embodiment, the first opening portion may include a first opening extended through the first side surface, and a second opening extended through a third side surface opposite to the first side surface.

In an exemplary embodiment, the first and second openings may each be extended through an upper surface of the body portion.

In an exemplary embodiment, an upper portion of the body portion may have a width greater than a width of a lower portion of the body portion.

In an exemplary embodiment, the lower portion of the body portion may include a fixing element protruded from a side surface of the lower portion.

In an exemplary embodiment, the first terminal may make contact with a first surface of the light source module. The second terminal may make contact with both first and second surfaces of the light source driver, where the first and second surfaces are opposite to each other.

In an exemplary embodiment according to the present invention, a backlight assembly includes a light source module part, a bottom chassis, a light source driver and a connector. The light source module part includes a light source substrate, and a plurality of light emitting diodes disposed on the light source substrate. The bottom chassis is disposed under the light source module part and receives the light source module part. The light source driver is disposed facing a bottom surface of the bottom chassis and drives the light source module part. The connector includes a body portion and a terminal portion. The body portion includes a first opening portion and a second opening portion. The first opening portion receives a portion of the light source module part. The second opening portion receives a portion of the light source driver. The terminal portion includes a first terminal and a second terminal. The first terminal is disposed in the first opening portion. The second terminal is connected to the first terminal. The second terminal is disposed in the second opening portion.

In an exemplary embodiment, the light source substrate may include a light source portion on which the light emitting diodes are disposed, and a light source terminal portion extended directly from the light source portion and on which an input terminal is disposed.

In an exemplary embodiment, the light source portion of the light source substrate may be extended in a first direction. The light source terminal portion of the light source substrate may be extended from an end portion of the light source portion in a second direction crossing the first direction. The first opening portion of the connector may be extended through an upper surface of the body portion and receive the light source terminal portion. The second opening portion may be extended through a side surface of the body portion substantially perpendicular to the upper surface of the body portion and receive the portion of the light source driver.

In an exemplary embodiment, the backlight assembly may further include a plurality of light source module parts. The light source module part includes a first light source module including a first light source terminal portion, and a second light source module including a second light source terminal portion. The first opening portion of the connector may include a first opening receiving the first light source terminal portion, and a second opening receiving the second light source terminal portion.

In an exemplary embodiment, the light source portion of the light source substrate may be extended in a first direction. The light source terminal portion of the light source substrate may be extended directly from an end portion of the light source portion in the first direction. The first opening portion of the connector may extend through a first side surface of the body portion and receive the light source terminal portion. The second opening portion may be extended through a second side surface of the body portion substantially perpendicular to the first side surface through which the first opening portion is extended and receive the portion of the light source driver.

In an exemplary embodiment, the backlight assembly may further include a plurality of light source module parts. The light source module part includes a first light source module including a first light source terminal portion, and a second light source module including a second light source terminal portion. The first opening portion of the connector may include a first opening extended through a first side surface of the body portion and receiving the first light source terminal portion, and a second opening extended through a third side surface of the body portion opposite to the first side surface of the body portion and receiving the second light source terminal portion.

In an exemplary embodiment, the first and second openings may both be extended through an upper surface of the body portion.

In an exemplary embodiment, the light source module part may further include a light emitting diode string including the light emitting diodes connected to each other in series.

In an exemplary embodiment, an anode (+) of a first light emitting diode of the light emitting diode string, which is the closest to the light source terminal portion, may be connected to the input terminal of the light source module part.

In an exemplary embodiment, the light source module part may further include a plurality of the light source emitting diode strings.

In an exemplary embodiment, the light source driver may include a balancing circuit adjusting a current flow through the light emitting diodes to have a uniform level. The balancing circuit may be connected to the anode (+) of the first light emitting diode through the connector.

In an exemplary embodiment, a cathode (−) of a second light emitting diode of the light emitting diode string, which is the farthest from the light source terminal portion, may be connected to the light source substrate and electrically grounded through the light source substrate.

In an exemplary embodiment, the bottom chassis may include an opening extended through a bottom plate of the bottom chassis and receiving the body portion of the connector. An upper portion of the body portion may be disposed over the bottom plate of the bottom chassis. A lower portion of the body portion may be disposed under the bottom plate of the bottom chassis.

In an exemplary embodiment, the upper portion of the body portion may include a protruding portion extending further than a side surface of the lower portion of the body portion. A lower surface of the protruding portion may make contact with an upper surface of the bottom plate of the bottom chassis.

In an exemplary embodiment, the lower portion of the body portion may include a fixing element protruded from the side surface of the lower portion. An upper surface of the fixing element may make contact with a lower surface of the bottom plate of the bottom chassis.

In an exemplary embodiment, the first terminal may make contact with a first surface of the light source module part. The second terminal may make contact with both first and second surfaces of the light source driver, the first and second surfaces being opposite to each other.

In an exemplary embodiment, the backlight assembly may further include a light guide plate. The light source module part may be extended along a first side surface of the light guide plate.

In an exemplary embodiment, the connector may be disposed adjacent to a central portion of the first side surface of the light guide plate.

In an exemplary embodiment, the connector may be disposed adjacent to an end portion of the first side surface of the light guide plate.

In an exemplary embodiment, the backlight assembly may further include a heat sink plate. The heat sink plate may be disposed on the bottom chassis. The heat sink plate may absorb a heat generated from the light source module part.

In an exemplary embodiment, an upper surface of the heat sink plate is coplanar with an upper surface of the connector.

According to the connector for a light source module and the backlight assembly including the connector, the connector directly receives portions of a light source module and a light source driver so that connecting wirings to connect the light source module and the light source driver may be omitted. Thus, a connecting structure of the backlight assembly may be simplified, and a manufacturing cost may be decreased. In addition, reliability of the backlight assembly may be improved.

BRIEF DESCRIPTION OF THE DRAWINGS

The above and other features and advantages of the present invention will become more apparent by describing in detailed exemplary embodiments thereof with reference to the accompanying drawings, in which.

DETAILED DESCRIPTION OF THE INVENTION

Figure 1:
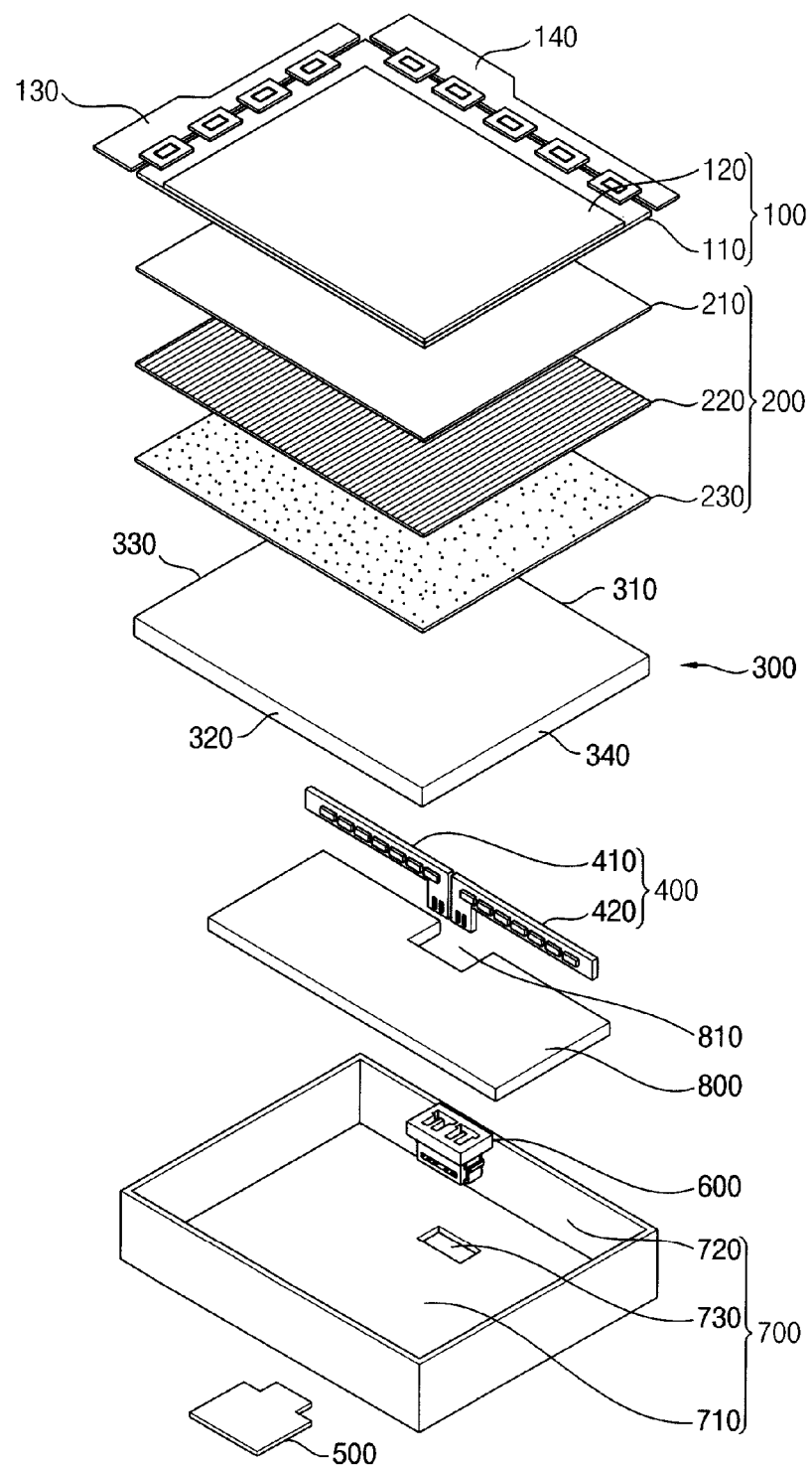
FIG. 1 is an exploded perspective view illustrating an exemplary embodiment of a display apparatus including a backlight assembly according to the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, "connected" includes physically and/or electrically connected. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be explained in detail with reference to the accompanying drawings.

Figure 2:
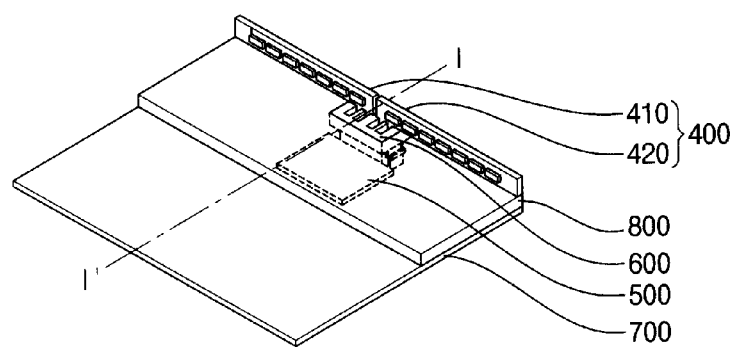
FIG. 2 is a perspective view illustrating the backlight assembly of FIG. 1.

FIG. 1 is an exploded perspective view illustrating an exemplary embodiment of a display apparatus including a backlight assembly according to the present invention. FIG. 2 is a perspective view illustrating the backlight assembly of FIG. 1.

Referring to FIGS. 1 and 2, the display apparatus includes a display panel 100, a light adjusting part 200 and the backlight assembly.

The display panel 100 displays images. The display panel 100 includes a first substrate 110, a second substrate 120, a liquid crystal layer (not shown in figures), a gate driver 130 and a data driver 140.

The first substrate 110 may be a thin film transistor substrate on which a thin film transistor is disposed. The second substrate 120 may be a color filter substrate on which a color filter is disposed. The liquid crystal layer (not shown) is disposed between the first and second substrates 110 and 120.

The gate driver 130 and the data driver 140 are both connected to the first substrate 110 and output driving signals to the first substrate 110. The drivers 130 and 140 may respectively include a flexible printed circuit ("FPC"), a driving chip mounted on the FPC, a printed circuit board ("PCB") connected to the FPC.

In one exemplary embodiment, for example, the display panel 100 may have a rectangular shape, having a long side and a short side in a plan view of the display apparatus.

The light adjusting part 200 may include a protecting sheet 210, a prism sheet 220, a diffusion sheet 230 and so on.

The protecting sheet 210 protects the prism sheet 220 from damage, such as scratches. The prism sheet 220 may include a plurality of prisms disposed at a uniform interval. Each of the prisms may have a triangular prism cross-sectional shape. The prism sheet 220 condenses a light diffused by the diffusion sheet 230 in a direction substantially perpendicular to the display panel 100. The diffusion sheet 230 includes a base substrate and a coating layer disposed on the base substrate. The coating layer may include a bead. The bead may have a globular shape. The diffusion sheet 230 diffuses a light provided from the backlight assembly so that luminance uniformity may be improved.

The backlight assembly includes a light guide plate 300, a light source module part 400, a light source driver 500, a connector 600 and a bottom chassis 700.

The light guide plate 300 guides a light generated from the light source module part 400. The light guide plate 300 may include a rectangular parallelepiped shape or a wedge shape in the plan view. The light guide plate 300 includes a first side surface 310 corresponding to the long side of the display panel 100, a second side surface 320 opposite to the first side surface 310, a third side surface 330 corresponding to the short side of the display panel 100 and a fourth side surface 340 opposite to the third side surface. As used herein, corresponding may indicate being substantially the same in shape, dimension and/or positional placement relative to another element.

The light source module part 400 generates a light, and outputs the light to the light guide plate 300. The light source module part 400 may be adjacent to and/or facing at least one of the side surfaces of the light guide plate 300. In one exemplary embodiment, for example, as shown in figures, the light source module part 400 may be adjacent to and facing the first side surface 310 of the light guide plate 300.

In another exemplary embodiment, for example, one of the light source module part 400 may be respectively adjacent to each of the first side surface 310 and the second side surface 320 of the light guide plate 300. Alternatively, the light source module part 400 may be adjacent to the third side surface 330 or the fourth side surface 340. One of the light source module part 400 may be respectively adjacent to each of the third side surface 330 and the fourth side surface 340.

Alternatively, the light source module part 400 may be adjacent to all of the first to fourth side surfaces 310 to 340 of the light guide plate 300.

The light source module part 400 may include a plurality of light source modules. As shown in figures, the light source module part 400 may include the first light source module 410 and the second light source module 420. When viewing the light source module part 400 from the second side surface 320 of the light guide plate 300, the first light source module 410 is disposed on a left side in a longitudinal direction of the light guide plate 300 with respect to a central portion of the light guide plate 300. The second light source module 420 is disposed on a right side in the longitudinal direction of the light guide plate 300 with respect to the central portion of the light guide plate 300.

The light source module part 400 may include a light source substrate and light emitting diodes disposed on the light source substrate. The light source module part 400 is explained in detail referring to FIGS. 4 and 7.

The light source driver 500 drives the light source module part 400. The light source driver 500 may face a lower surface of a bottom plate 710 of the bottom chassis 700. The light source driver 500 may make contact with the lower surface of the bottom plate 710 of the bottom chassis 700. Alternatively, the light source driver 500 may be separated from the lower surface of the bottom plate 710 of the bottom chassis 700. The light source driver 500 may be combined with the lower surface of the bottom plate 710 of the bottom chassis 700 through a fastening member, such as a screw. The light source driver 500 is explained in detail referring to FIG. 8.

The connector 600 respectively receives portions of the light source module part 400 and the light source driver 500, and electrically connects the light source module part 400 to the light source driver 500.

The connector 600 is disposed in an area corresponding to a light source terminal portion of the light source module part 400. In one exemplary embodiment, for example, the light source terminal portion may be disposed in a central portion of a side portion of the light guide plate 300. As shown in figures, the light source terminal portion may be disposed adjacent to a central portion of the first side surface 310 of the light guide plate 300.

In one exemplary embodiment, for example, when the light source module part 400 is disposed adjacent to a single side surface of the light guide plate 300, the connector 600 may respectively receive the portions of the light source module part 400 and the light source driver 500, and thereby directly connect the light source module part 400 to the light source driver 500.

Alternatively, when the light source module part 400 is disposed adjacent to a plurality of side surfaces of the light guide plate 300, only one of the connector 600 may directly connect the light source module part 400 to the light source driver 500. Another exemplary embodiment of the connector 600 may receive a flexible printed circuit board and/or a connecting wire to connect the light source module part 400 to the light source driver 500. Alternatively, the number of the light source driver 500 is equal to the number of the number of the light source module part 400, so that all of the connectors 600 may directly connect the light source module part 400 to the light source driver 500 respectively. The connector 600 is explained in detail referring to FIGS. 3, 5 and 6.

The bottom chassis 700 is disposed under the light guide plate 300 and receives the display panel 100, the light adjusting part 200, and the light guide plate 300. The bottom chassis 700 includes the bottom plate 710 and a plurality of side walls 720 extended from the bottom plate 710. The light source module part 400 may make contact with the side wall 720. Alternatively, the light source module part 400 may be combined with the side wall 720 through a fastening member, such as a screw. In FIG. 2, the side walls 720 are omitted for convenience of explanation.

The bottom chassis 700 is combined with the connector 600. An opening 730 is at the bottom plate 710 of the bottom chassis 700 at which the connector 600 is combined. The opening 730 in the bottom plate 710 is an enclosed opening completely penetrating a thickness of the bottom plate 710, such that the bottom plate 710 solely defines the enclosed opening 730.

The backlight assembly may further include a heat sink plate 800 disposed on the bottom chassis 700 and overlapping the bottom plate 710. The heat sink plate 800 absorbs a heat generated from the light source module part 400.

A recess portion 810 may be in the heat sink plate 800, such as extending from an outer edge of the heat sink plate 800 towards an inner area of the heat sink plate 800. The recess portion 810 may have a planar area corresponding to an area of the connector 600.

The heat sink plate 800 may be overlapped with a planar area of the light guide plate 300 adjacent to the first side surface 310 where the light source module part 400 is disposed. Alternatively, the heat sink plate 800 may be overlapped with an entire planar area of the light guide plate 300 except for a planar area of the recess portion 810.

Although not shown in figures, the backlight assembly may further include a reflecting plate disposed between the bottom chassis 700 and the heat sink plate 800.

Although not shown in figures, the display apparatus may further include a top chassis and/or a mold frame disposed on the display panel 100. The top chassis may be combined with the bottom chassis 700. The mold frame may improve solidity of the combination of the display apparatus.

In the illustrated exemplary embodiment, although an edge type backlight assembly including the light source module part 400 at an edge portion of the display panel 100 is shown by example, however, the backlight assembly may be a direct type backlight assembly including the light source module part 400 directly under and overlapping a lower surface of the display panel 100 in an alternative exemplary embodiment.

Figure 3:
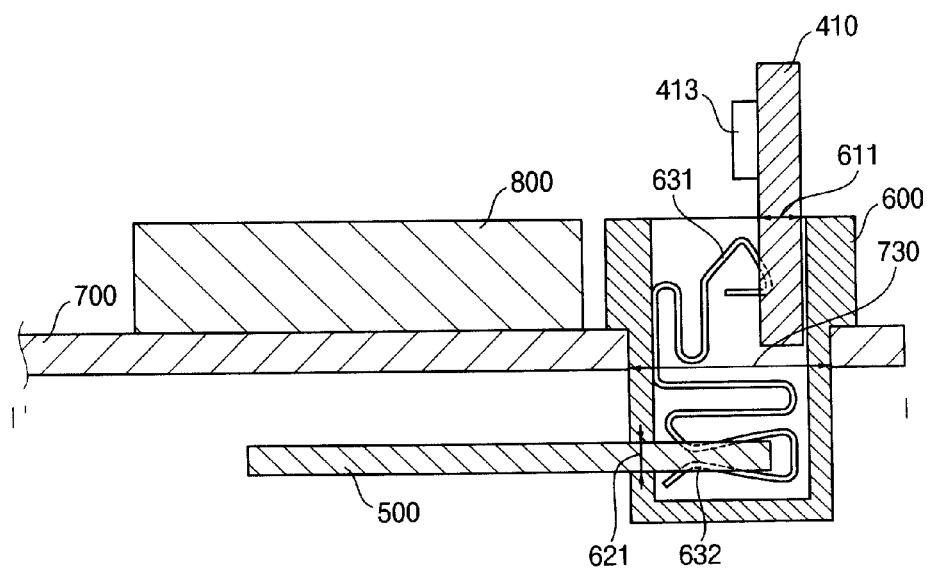
FIG. 3 is a cross-sectional view taken along line I-I' of FIG. 2.

FIG. 3 is a cross-sectional view taken along line I-I' of FIG. 2.

Referring to FIGS. 2 and 3, the connector 600 receives portions of the light source module part 400 through a first opening portion 611 at an upper surface of the connector 600. The connector 600 receives the light source driver 500 through a second opening portion 621 at a side surface of the connector 600. A direction in which the light source module part 400 is inserted into the connector 600 may be substantially perpendicular to a direction in which the light source driver 500 is inserted into the connector 600. After the light source module part 400 and the light source driver 500 are inserted into the connector 600, the light source module part 400 and the light source driver 500 are disposed perpendicular to each other as shown in FIG. 3. The connector 600 may be a single, unitary and indivisible member, as illustrated in FIG. 3.

The light source module part 400 makes contact with a first terminal 631 of the connector 600, and is electrically connected to the first terminal 631. The light source driver 500 makes contact with a second terminal 632 of the connector 600, and is electrically connected to the second terminal 632. The second terminal 632 is physically and/or electrically connected to the first terminal 631. A first surface of the first light source module 410 may make contact with the first terminal 631. A first surface of the light source driver 500, and a second surface opposite to the first surface, may make contact with the second terminal 632.

As illustrated in FIG. 3, the first terminal 631 and the second terminal 632 are a continuous, single and unitary member having a first end connected to the light source module part 400, and a second end opposite to the first end and connected to the light source driver 500. An internal area of the connector 600 is open to an outside of the connector 600 through the first opening portion 611 and through the second opening portion 621. The internal area of the connector is continuous from the first opening portion 611 to the second opening portion 621. The single continuous member collectively formed by the first terminal 631 and the second terminal 632 is completely within the internal area of the connector 600, and extends from one end of the internal area corresponding to the first opening portion 611 to an opposite end of the internal area corresponding to the second opening portion 621. That is, the first terminal 631 and the second terminal 632 may be accessed through the first opening portion 611 and the second opening portion 621, respectively.

As explained above, the connector 600 receives portions of both the light source module part 400 and the light source driver 500. The connector 600 includes the first opening portion 611 receiving the light source module part 400, and the second opening portion 621 receiving the light source driver 500, from the outside of the connector 600. When the light source module part 400 is inserted into the connector 600, a portion of the light source module part 400 is within the internal area of the connector 600 and a portion remains at an outside of the connector 600. Similarly, when the light source driver 500 is inserted into the connector 600, a portion of the light source driver 500 is within the internal area of the connector 600 and a portion remains at an outside of the connector 600.

The connector 600 includes the first terminal 631 disposed in the first opening portion 611, and the second terminal 632 physically and electrically connected to the first terminal 631 and disposed in the second opening portion 621.

The connector 600 passes through the bottom plate 710 of the bottom chassis 700, such that a portion of the connector 600 extends above the bottom plate 710 and a portion extends below the bottom plate 710. The bottom chassis 700 includes the opening 730 to receive the connector 600. An upper portion of a body portion of the connector 600 is disposed over the bottom plate 710 of the bottom chassis 700, and a lower portion of the body portion is disposed under the bottom plate 710 of the bottom chassis 700. The upper portion and the lower portion of the body collective form the single, unitary and indivisible member of the connector 600.

In the illustrated exemplary embodiment, although the connector 600 passes through the bottom plate 710 of the bottom chassis 700, the connector 600 may pass through a side wall of the bottom chassis 700. Alternatively, the connector 600 may pass through both the bottom plate 710 and the side wall of the bottom chassis 700.

The heat sink plate 800 is disposed directly on an upper surface of the bottom chassis 700. An upper surface of the heat sink plate 800 may have substantially the same height as the upper surface of the connector 600, such that the upper surfaces are coplanar with each other. Accordingly, the light guide plate 300 may be stably disposed on the connector 600 and the heat sink plate 800. More specifically, the light guide plate 300 overlaps and/or contacts the upper surfaces of the connector 600 and the heat sink plate 800.

Figure 4:
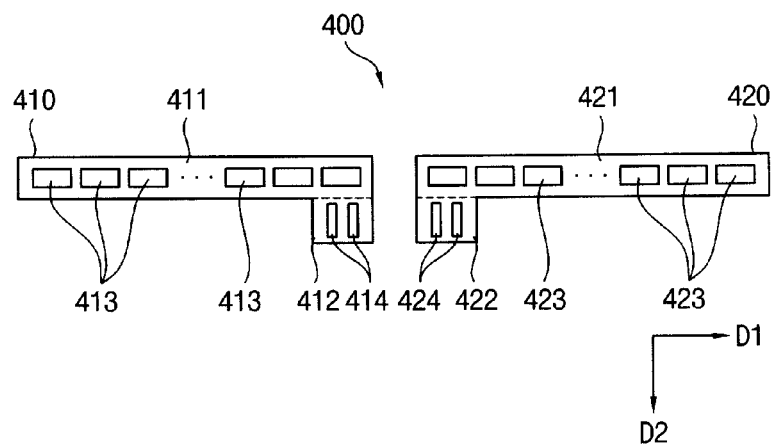
FIG. 4 is a plan view illustrating a light source module part of FIG. 2.

FIG. 4 is a plan view illustrating the light source module part 400 of FIG. 2.

Referring to FIG. 4, the light source module part 400 includes the light source substrate, and the light emitting diodes disposed on the light source substrate. The light source substrate includes a light source portion, on which the light emitting diodes are disposed, and the light source terminal portion extended from the light source portion. An input terminal for driving the light emitting diodes is disposed on the light source terminal portion.

In the illustrated exemplary embodiment, the light source module part 400 includes the first light source module 410 and the second light source module 420. A first light source substrate of the first light source module 410 includes a first light source portion 411, on which a plurality of first light emitting diodes 413 are disposed, and a first light source terminal portion 412 extended directly from the first light source portion 411 and on which an input terminal 414 for driving the first light emitting diodes 413 is disposed. The first light source portion 411 is longitudinally extended in a first direction D1. The first light source terminal portion 412 is extended from an end portion of the first light source portion 411 in a second direction D2 crossing the first direction D1.

A second light source substrate of the second light source module 420 includes a second light source portion 421, on which a plurality of second light emitting diodes 423 are disposed, and a second light source terminal portion 422 extended directly from the second light source portion 421 and on which an input terminal 424 for driving the second light emitting diodes 423 is disposed. The second light source portion 421 is longitudinally extended in the first direction D1. The second light source terminal portion 422 is extended from an end portion of the second light source portion 421 in the second direction D2.

The first and second light source terminal portions 412 and 422 are extended in a direction crossing a direction in which the first and second light source portions 411 and 421 are longitudinally extended, so that a dark portion of the light source module part 400 may not be formed. Thus, luminance uniformity within the display apparatus may be improved.

Figure 5:
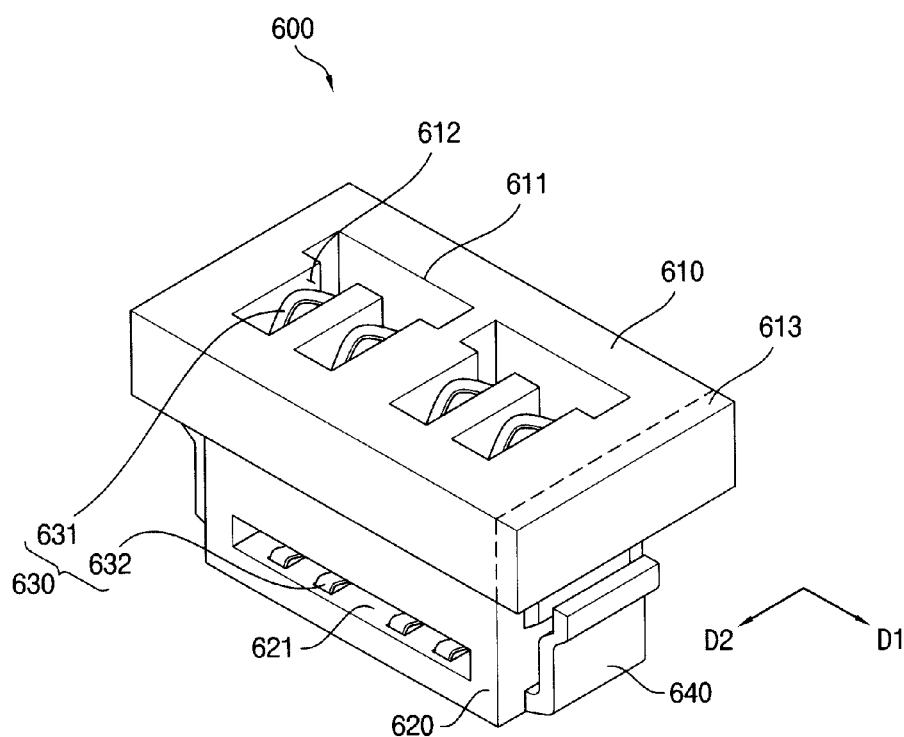
FIG. 5 is a perspective view illustrating a connector of FIG. 2.
Figure 6:
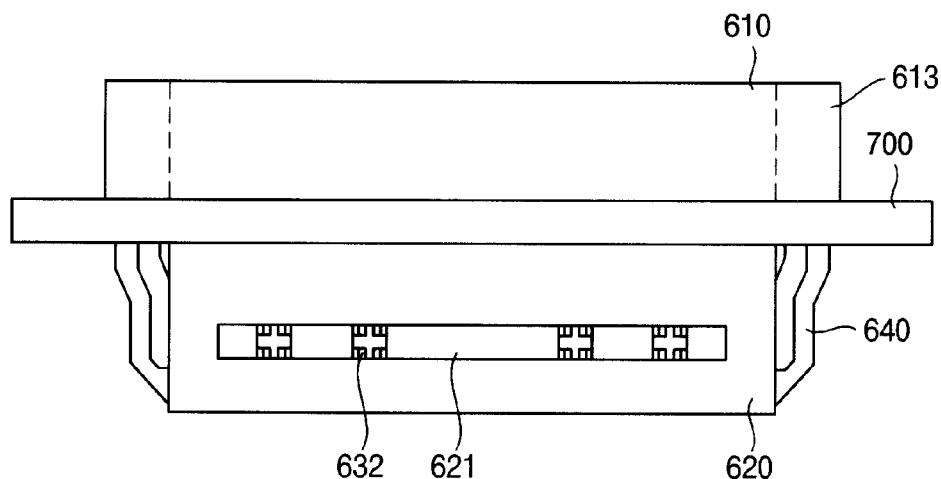
FIG. 6 is a front view illustrating a combining structure between the connector and a bottom chassis of FIG. 2.

FIG. 5 is a perspective view illustrating the connector 600 of FIG. 2. FIG. 6 is a front view illustrating a combined structure of the connector 600 and the bottom chassis 700 of FIG. 2.

Referring to FIGS. 5 and 6, the connector 600 includes the body portion and a terminal portion 630. The first opening portion 611 receiving the light source module part 400 and the second opening portion 621 receiving the light source driver 500 are within the body portion. The terminal portion 630 includes the first terminal 631 disposed in the first opening portion 611, and the second terminal 632 connected to the first terminal 631 and disposed in the second opening portion 621.

The body portion may include an upper portion 610 and a lower portion 620. The upper portion 610 may have a rectangular parallelepiped shape. The lower portion 620 may have a rectangular parallelepiped shape. The upper portion 610 has a width in the second direction D2 greater than a width in the second direction D2 of the lower portion 620. The upper portion 610 includes a protruding portion 613 which extends further than a side surface of the lower portion 620, in the first direction D1. The protruding portion 613 may be protruded with respect to each of four side surfaces of the lower portion 620. Alternatively, the protruding portion 613 may be protruded with respect to only two side surfaces of the lower portion 620 which are opposite to each other. A lower surface of the protruding portion 613 may make contact with the upper surface of the bottom plate 710 of the bottom chassis 700.

The body portion of the connector 600 passes through the bottom chassis 700, such that a portion of the lower portion 620 is within the opening 730 and overlapping the thickness of the bottom plate 710, while a remaining portion of the lower portion 620 extends below the bottom plate 710 of the bottom chassis 700. When the connector 600 is coupled to the bottom chassis 700, the upper portion 610 of the body portion is disposed over the bottom plate 710 of the bottom chassis 700, and the lower portion 620 of the body portion is disposed under the bottom plate 710 of the bottom chassis 700.

A terminal opening portion 612 may be further in the upper portion 610 of the body portion in which is the first terminal 631. The first opening portion 611 may have a rectangular shape of which a longitudinal side is extended in the first direction D1. The terminal opening portion 612 may have a rectangular shape of which a longitudinal side is extended directly from the first opening portion 611 in the second direction D2 substantially perpendicular to the first direction D1. A plurality of the terminal opening portions 612 may be in the upper portion 610.

The first terminal 631 is protruded toward an inside of the first opening portion 611. The first terminal 631 may be protruded from a single side surface. The first terminal 631 may be protruded from a single side surface of the first opening portion 611 corresponding to the longitudinal side of the first opening portion 611, as illustrated in FIGS. 3 and 5. Alternatively, the first terminal 631 may be protruded from two side surfaces of the first opening portion 611 opposite to each other. A plurality of the first terminals 631 may be within the continuous open area formed by the first opening portion 611 and the terminal opening portion 612.

The first opening portion 611 and the terminal opening portion 612 are at an upper surface of the upper portion 610 of the body portion. The first opening portion 611 and the terminal opening portion 612 may collectively include a pair of continuous openings. A first continuous opening may include a first opening portion 611 and the terminal opening portion 612 at a left side of the connector 600, and a second continuous opening may include the first opening portion 611 and the terminal opening portion 612 at a right side of the connector 600.

The second opening portion 621 may have a rectangular shape of which a longitudinal side is extended in the first direction D1. The second terminal 632 is protruded from the outside of the connector 600 toward an inside of the second opening portion 621. The second terminal 632 may be protruded from two side surfaces of the second opening portion 621 opposite to each other. The second terminal 632 may be protruded from two side surfaces corresponding to the longitudinal side of the second opening portion 621. The second terminal 632 may be protruded from a single side surface of the second opening portion 621. A plurality of the second terminals 632 may be within the second opening portion 621.

The lower portion 620 of the body portion includes a fixing element 640 extended outwardly from a side surface of the lower portion 620. The fixing element 640 may be protruded from the side surface of the lower portion 620. The fixing element 640 may be at two side surfaces of the lower portion 620 opposite to each other. The fixing element 640 may extend further from the side surface of the connector 600 in a direction taken from a lower portion of the fixing element 640 to an upper portion of the fixing element 640. When the connector 600 includes the fixing element 640, the connector 600 may be combined with the opening 730 of the bottom chassis 700 by sliding downwardly within the opening 730. The connector 600 including the fixing element 640 is slidably disposed with respect to edges of the opening 730, such that the connector 600 is retained between the edges of the opening 730. A length of the opening 730 in the first direction D1 is large enough to accommodate the fixing element 640 of the connector 600 as the connector 600 is being inserted through the opening 730.

An upper surface of the fixing element 640 may make contact with the lower surface of the bottom plate 710 of the bottom chassis 700. The upper surface of the fixing element 640 is separated from a lower surface of the protruding portion 613 of the upper portion 610 of the body of the connector 600, as illustrated in FIG. 5. When the connector 600 is coupled to the bottom chassis 700, a portion of or an entire of the thickness of the bottom plate 710 is between the upper surface of the fixing element 640 and the lower surface of the protruding portion 613.

Figure 7:
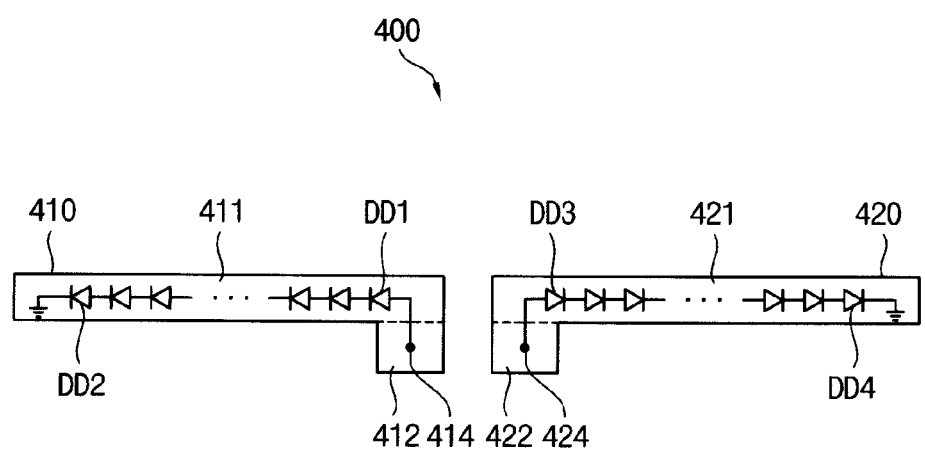
FIG. 7 is a circuit diagram illustrating a light emitting diode string of the light source module part of FIG. 2.

FIG. 7 is a circuit diagram illustrating a light emitting diode string of the light source module part 400 of FIG. 2.

Referring to FIG. 7, the light source module part 400 includes the light emitting diodes 413 on the first light source module 410 and the light emitting diodes 423 on the second light source module 420. The light source module part 400 includes a light emitting diode string on one or both of the first and second light source modules 410 and 420, where the light emitting diode string includes the respective light emitting diodes connected to each other in series.

The first light source module 410 may include a single light emitting diode string. In this case, all of the light emitting diodes 413 are dependently driven. The driving method where the light emitting diodes are dependently driven is called as a global dimming method. Alternatively, the first light source module 410 may include a plurality of the light emitting diode strings. In this case, the light emitting diodes 413 may be independently driven. The driving method where the light emitting diodes are independently driven is called as a local dimming method.

An anode (positive electrode) of a first light emitting diode DD1, which is the closest to the first light source terminal portion 412 in the light emitting diode string, is electrically connected to the input terminal 414 of the first light source module 410. When the first light source module 410 includes a plurality of the light emitting diode strings, anodes of first light emitting diodes DD1, which are the closest to the first light source terminal portion 412 in the light emitting diode string, may be electrically connected to the input terminal 414 of the first light source module 410.

A cathode (negative electrode) of a second light emitting diode DD2, which is the farthest from the first light source terminal portion 412 in the light emitting diode string, is electrically connected to the light source substrate of the first light source module 410 and electrically grounded. When the first light source module 410 includes the plurality of the light emitting diode strings, cathodes of second light emitting diodes DD2, which are the farthest from the first light source terminal portion 412 in the light emitting diode string, may be electrically connected to the light source substrate of the first light source module 410 and electrically grounded. The second light emitting diodes DD2 may be electrically grounded through a grounding member, such as screw (not shown in figures). Alternatively, the cathode of the second light emitting diode DD2 may be connected to a feedback electrode (not shown in figures) of the first light source terminal portion 412.

The second light source module 420 may include a single light emitting diode string. Alternatively, the second light source module 420 may include a plurality of the light emitting diode strings.

An anode of a third light emitting diode DD3, which is the closest to the second light source terminal portion 422 in the light emitting diode string, is electrically connected to the input terminal 424 of the second light source module 420.

A cathode of a fourth light emitting diode DD4, which is the farthest from the second light source terminal portion 422 in the light emitting diode string, is electrically connected to the light source substrate of the second light source module 420 and electrically grounded.

Figure 8:
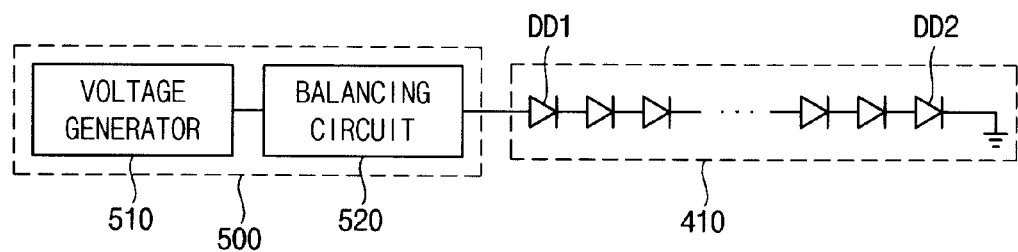
FIG. 8 is a block diagram illustrating a light source driver and the light source module part of FIG. 2.

FIG. 8 is a block diagram illustrating the light source driver 500 and the light source module part 400 of FIG. 2.

Referring to FIG. 8, the light source driver 500 includes a voltage generator 510 and a balancing circuit 520. The voltage generator 510 generates a voltage for driving the light emitting diodes of the light source module part 400. The balancing circuit 520 adjusts a current flow through the light emitting diodes to have a uniform level. While the first light source module 410, and the first light emitting diode DD1 and second light emitting diode DD2 are illustrated, the block diagram of FIG. 8 may similarly apply to the second light source module 420, the third light emitting diode DD3 and the fourth light emitting diode DD4.

When the first light source module 410 includes the plurality of the light emitting diode strings, the balancing circuit 520 adjusts current flows through the respective light emitting diode strings of the first light source module 410, to have a uniform level in order to secure a luminance uniformity of the light emitting diode strings. The balancing circuit 520 may include a current mirror circuit.

The anode of the first light emitting diode DD1 in the first light source module 410 is directly connected to the balancing circuit 520. The connecting structure is called a hot balance structure. In the hot balance structure, the cathode of the second light emitting diode DD2 is connected to the light source substrate of the second light source module 420 of the second light source module 420 and electrically grounded. Accordingly, a feedback wiring may be omitted so that a connecting structure may be simplified.

Alternatively, the anode of the first light emitting diode DD1 may be directly connected to the voltage generator 510, and the cathode of the second light emitting diode DD2 may be directly connected to the balancing circuit 520. The connecting structure is called a cold balance structure. In the cold balance structure, the first light source terminal portion 412 includes the input terminal 414 and a feedback terminal.

According to the illustrated exemplary embodiment, the connector directly receives the light source module part and the light source driver so that connecting wirings may be omitted. Thus, a manufacturing cost of the backlight assembly and the display apparatus may be decreased. Reliability of the backlight assembly may be improved. In addition, the light emitting diodes are electrically grounded through the light source substrate so that feedback wirings may be omitted.

Figure 9:
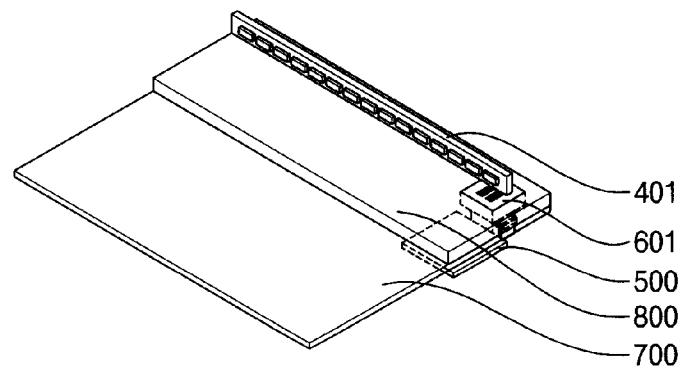
FIG. 9 is a perspective view illustrating another exemplary embodiment of a backlight assembly according to the present invention.

FIG. 9 is a perspective view illustrating another exemplary embodiment of a backlight assembly according to the present invention.

A connector and a backlight assembly according to the illustrated exemplary embodiment are substantially the same as the connector 600 and the backlight assembly of the previous exemplary embodiment explained referring to FIGS. 1 to 8 except for a shape of a light source module part 401, and a position and shape of a connector 601. Thus, the same reference numerals will be used to refer to the same or like parts as those described in the previous exemplary embodiment of FIGS. 1 to 8 and any repetitive explanation concerning the above elements will be omitted.

Referring to FIGS. 1 and 9, the backlight assembly includes the light guide plate 300, the light source module part 401, the light source driver 500, the connector 601 and the bottom chassis 700.

The light guide plate 300 includes the first side surface 310 corresponding to a long side of the display panel 100, the second side surface 320 opposite to the first side surface 310, the third side surface 330 corresponding to a short side of the display panel 100 and the fourth side surface 340 opposite to the third side surface.

The light source module part 401 is adjacent to the first side surface 310 of the light guide plate 300. The light source module part 401 includes a single light source module. As shown in figures, the light source module part 401 includes only a single first light source module 410. The first light source module 410 may have a length substantially the same as a length of a first side of the light guide plate 300 adjacent to the first side surface 310 of the light guide plate 300. The light source module part 401 is explained in detail referring to FIG. 10.

The connector 601 respectively receives portions of both the light source module part 401 and the light source driver 500, and electrically connects the light source module part 401 to the light source driver 500.

The connector 601 is disposed in an area corresponding to the light source terminal portion of the light source module part 401. As shown in figures, the light source terminal portion may be disposed adjacent to a longitudinal end portion of the first side surface 310 of the light guide plate 300. The connector 601 is explained in detail referring to FIG. 11.

The bottom chassis 700 is disposed under the light guide plate 300, and receives the display panel 100, the light adjusting part 200, and the light guide plate 300. The bottom chassis 700 includes the bottom plate 710, and a plurality of the side walls 720 extended from the bottom plate 710. In FIG. 9, the side walls 720 are omitted for convenience of explanation.

The bottom chassis 700 is combined with the connector 601. An opening 730 is in the bottom plate 710 of the bottom chassis 700 at which the connector 601 is combined.

Figure 10:
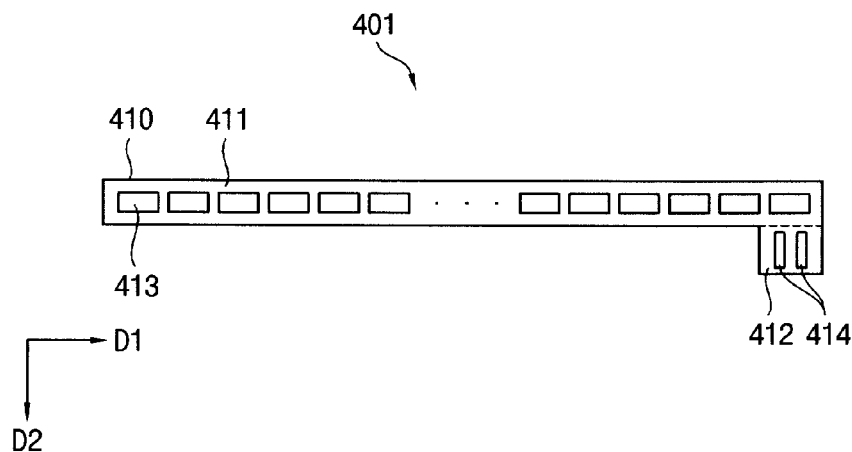
FIG. 10 is a plan view illustrating a light source module part of FIG. 9.

FIG. 10 is a plan view illustrating the light source module part 401 of FIG. 9.

Referring to FIG. 10, the light source module part 401 includes the light source substrate and a plurality of light emitting diodes. The light source substrate includes the light source portion, on which the light emitting diodes are disposed, and the light source terminal portion extended from the light source portion. The input terminal for driving the light emitting diodes is disposed on the light source terminal portion.

In the illustrated exemplary embodiment, the light source module part 401 includes only the first light source module 410. The first light source substrate of the first light source module 410 includes only the first light source portion 411, on which first light emitting diodes 413 are disposed, and only the first light source terminal portion 412 extended from the first light source portion 411, on which the input terminal 414 for driving the light emitting diodes 413 is disposed. The first light source portion 411 is longitudinally extended in a first direction D1. The first light source terminal portion 412 is extended directly from an end portion of the first light source portion 411 in a second direction D2 crossing the first direction D1.

Figure 11:
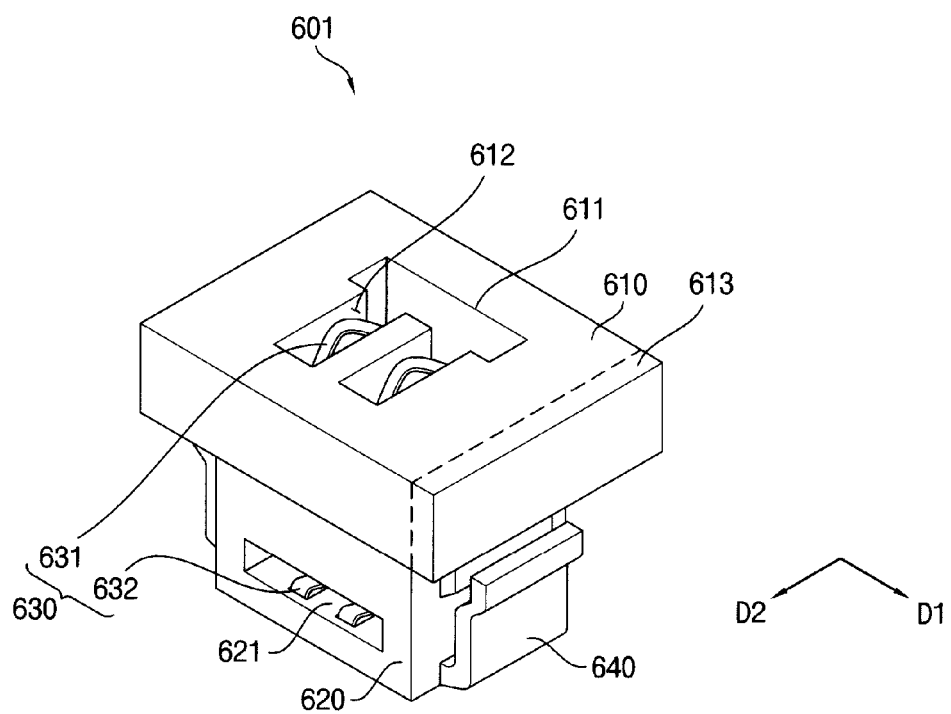
FIG. 11 is a perspective view illustrating a connector of FIG. 9.

FIG. 11 is a perspective view illustrating the connector 601 of FIG. 9.

Referring to FIG. 11, the connector 601 includes the body portion and the terminal portion 630.

The first opening portion 611 directly receiving the light source module part 401, and the second opening portion 621 receiving the light source driver 500 are in the body portion. The terminal portion 630 includes the first terminal 631 disposed in the first opening portion 611, and the second terminal 632 physically and electrically connected to the first terminal 631 and disposed in the second opening portion 621.

A terminal opening portion 612 may be further in the upper portion 610 of the body portion to insert the first terminal 631.

The first opening portion 611 and the terminal opening portion 612 are at the upper surface of the upper portion 610 of the body portion. As discussed above, a continuous open area is collectively formed by the first opening portion 611 and the terminal opening portion 612. In the illustrated exemplary embodiment, the first opening portion 611 and the terminal opening 612 forms a single continuous open area. In the exemplary embodiments of FIGS. 1 to 8 and FIGS. 9 to 11, respectively, the connector includes the same number of single continuous open areas (e.g., collectively the first opening portion 611 and the terminal opening 612), as the number of light source substrates of the light source module part. In other words, the single continuous open areas and the light source substrates are in one-to-one correspondence.

The lower portion 620 of the body portion includes the fixing element 640 extended from the side surface of the lower portion 620. The fixing element 640 may be protruded from the side surface of the lower portion 620.

Figure 12:
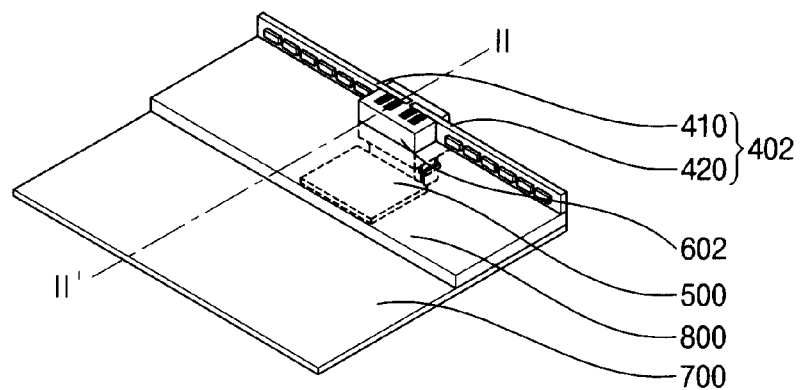
FIG. 12 is a perspective view illustrating still another exemplary embodiment of a backlight assembly according to the present invention.

FIG. 12 is a perspective view illustrating still another exemplary embodiment of a backlight assembly according to the present invention.

A connector and a backlight assembly according to the illustrated exemplary embodiment are substantially the same as the connector 600 and the backlight assembly of the previous exemplary embodiment explained referring to FIGS. 1 to 8 except for a shape of a light source module part 402, a shape of a connector 602. Thus, the same reference numerals will be used to refer to the same or like parts as those described in the previous exemplary embodiment of FIGS. 1 to 8 and any repetitive explanation concerning the above elements will be omitted.

Referring to FIGS. 1 and 12, the backlight assembly includes the light guide plate 300, the light source module part 402, the light source driver 500, the connector 602 and the bottom chassis 700.

The light guide plate 300 includes the first side surface 310 corresponding to a long side of the display panel 100, the second side surface 320 opposite to the first side surface 310, the third side surface 330 corresponding to a short side of the display panel 100 and the fourth side surface 340 opposite to the third side surface.

The light source module part 402 is adjacent to the first side surface 310 of the light guide plate 300. The light source module part 402 may include a plurality of separate light source modules. As shown in figures, the light source module part 402 may include the first light source module 410 and the second light source module 420. The first light source module 410 is disposed on a left side in a longitudinal direction of the light guide plate 300 with respect to a central portion of the light guide plate 300. The second light source module 420 is disposed on a right side in the longitudinal direction of the light guide plate 300 with respect to the central portion of the light guide plate 300. The light source module part 402 is explained in detail referring to FIG. 14.

The connector 602 respectively directly receives portions of both the light source module part 402 and the light source driver 500, and electrically connects the light source module part 402 to the light source driver 500.

The connector 602 is disposed in an area corresponding to the light source terminal portion of the light source module part 402. As shown in figures, the light source terminal portion may be disposed adjacent to a central portion of the first side surface 310 of the light guide plate 300. The connector 602 is explained in detail referring to FIGS. 13 and 15.

The bottom chassis 700 is disposed under the light guide plate 300, and receives the display panel 100, the light adjusting part 200, and the light guide plate 300. The bottom chassis 700 includes the bottom plate 710, and the plurality of the side walls 720 extended from the bottom plate 710. In FIG. 12, the side walls 720 are omitted for convenience of explanation.

The bottom chassis 700 is combined with the connector 602. The opening 730 is in the bottom plate 710 of the bottom chassis 700 at which the connector 602 is combined.

Figure 13:
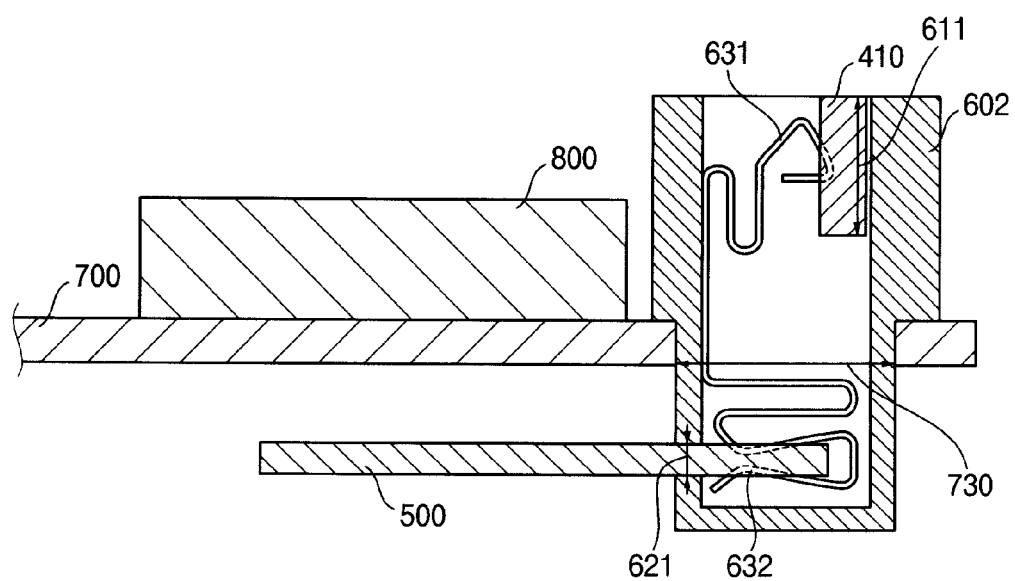
FIG. 13 is a cross-sectional view taken along line II-II' of FIG. 12.

FIG. 13 is a cross-sectional view taken along line II-II' of FIG. 12.

Referring to FIGS. 12 and 13, the connector 602 directly receives portions of the light source module part 402 through the first opening portion 611 at a first side surface of the connector 602. The connector 602 receives the light source driver 500 through the second opening portion 621 at a second side surface of the connector 602 substantially perpendicular to the first side surface. A direction in which the light source module part 402 is inserted into the connector 602 may be substantially perpendicular to a direction in which the light source driver 500 is inserted into the connector 602.

The light source module part 402 makes contact with the first terminal 631 of the connector 602. The light source driver 500 makes contact with a second terminal 632 of the connector 602 connected to the first terminal 631.

As explained above, the connector 602 directly receives portions of both the light source module part 402 and the light source driver 500. The connector 602 includes the first opening portion 611 receiving the light source module part 402, and the second opening portion 621 receiving the light source driver 500.

The connector 602 includes the first terminal 631 disposed in the first opening portion 611, and the second terminal 632 physically and electrically connected to the first terminal 631 and disposed in the second opening portion 621.

An upper surface of the light source module part 402 may have substantially the same height as the upper surface of the connector 602, such that the upper surfaces are coplanar with each other, as illustrated in FIG. 13.

The connector 602 passes through the bottom plate 710 of the bottom chassis 700. The bottom chassis 700 includes the opening 730 to receive the connector 602. The upper portion of a body portion of the connector 602 is disposed over the bottom chassis 700, and the lower portion of the body portion is disposed under the bottom chassis 700.

Figure 14:
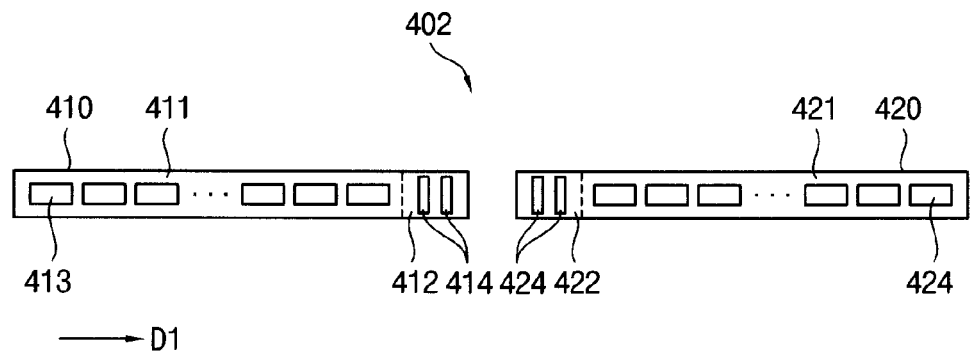
FIG. 14 a plan view illustrating a light source module part of FIG. 12.

FIG. 14 is a plan view illustrating the light source module part 402 of FIG. 12.

Referring to FIG. 14, the light source module part 402 includes the light source substrate and the plurality of light emitting diodes. The light source substrate includes the light source portion, on which the light emitting diodes are disposed, and the light source terminal portion extended from the light source portion. The input terminal for driving the light emitting diodes is disposed on the light source terminal portion.

In the illustrated exemplary embodiment, the light source module part 402 includes the first light source module 410 and the second light source module 420. A first light source substrate of the first light source module 410 includes a first light source portion 411, on which first light emitting diodes 413 are disposed, and a first light source terminal portion 412 extended directly from the first light source portion 411, on which an input terminal 414 for driving the first light emitting diodes 413 is disposed. The first light source portion 411 is extended in a first direction D1. The first light source terminal portion 412 is extended from an end portion of the first light source portion 411 in the first direction D1.

A second light source substrate of the second light source module 420 includes a second light source portion 421, on which second light emitting diodes 423 are disposed, and a second light source terminal portion 422 extended from the second light source portion 421, on which an input terminal 424 for driving the second light emitting diodes 423 is disposed. The second light source portion 421 is extended in the first direction D1. The second light source terminal portion 422 is extended from an end portion of the second light source portion 421 in a direction opposite to the first direction D1.

Figure 15:
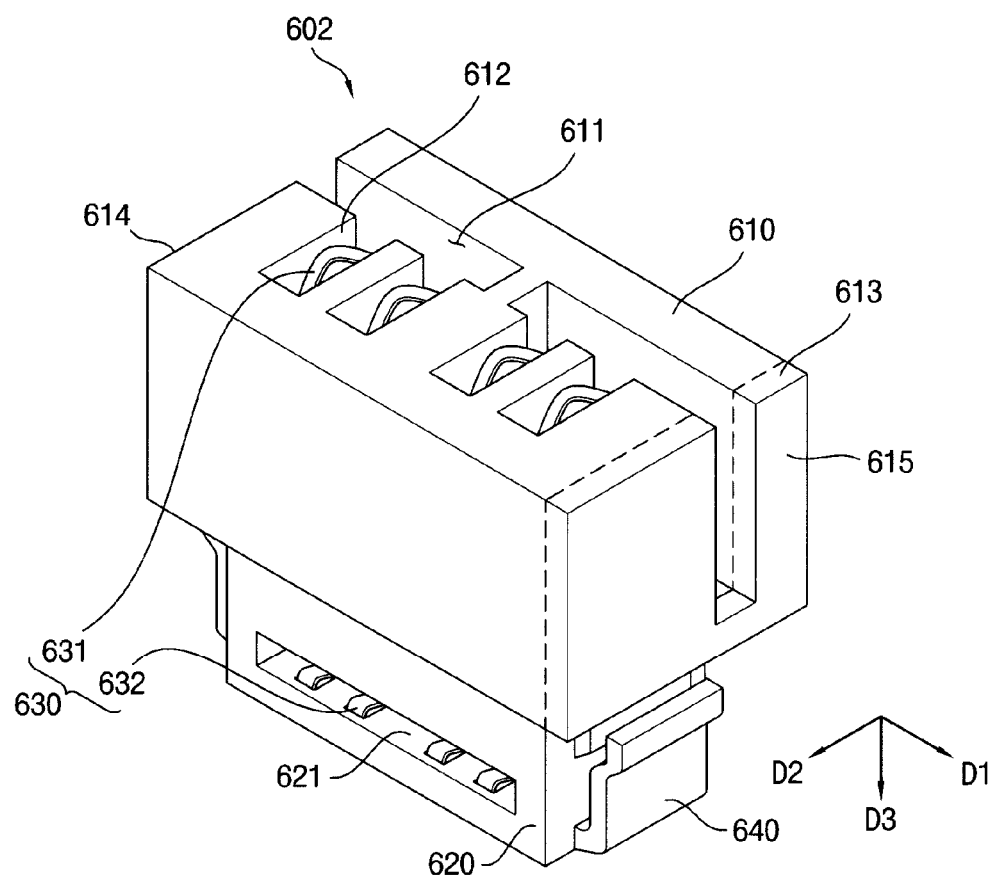
FIG. 15 is a perspective view illustrating a connector of FIG. 12.

FIG. 15 is a perspective view illustrating the connector 602 of FIG. 12.

Referring to FIGS. 12 and 15, the connector 602 includes the body portion and the terminal portion 630.

The first opening portion 611 receiving the light source module part 402, and the second opening portion 621 receiving the light source driver 500 are at the body portion. Specifically, the first light source terminal portion 412 and the second light source terminal portion 422 are received in the respective first opening portion 611 of the connector 602. The terminal portion 630 includes the first terminal 631 disposed in the first opening portion 611, and the second terminal 632 connected to the first terminal 631 and disposed in the second opening portion 621. The first light source terminal portion 412 and the second light source terminal portion 422 of the light source module part 402 may be physically and electrically connected to first terminals 631 within the first opening portion 611 of the connector 602.

The terminal opening portion 612 may be further at the upper portion 610 of the body portion in which is inserted the first terminal 631. The first opening portion 611 may have a rectangular shape profile in a plan view of which a longitudinal side is extended in the first direction D1. The first opening portion 611 may also have a rectangular shape profile in a cross-sectional view of which a longitudinal side is extended in a third direction D3, as illustrated in FIG. 15.

The first opening portion 611 is at both a side surface of the upper portion 610 of the body portion and at an upper surface of the upper portion 610 of the body portion. An internal area of the connector 602 is open to an outside of the connector 602 through the first opening portion 611 and through the second opening portion 621. The internal area of the connector 602 is continuous from the first opening portion 611 to the second opening portion 621.

The first opening portion 611 may include a pair of openings continuous with each other. Each of the continuous of the first opening portions 611 includes a first opening extending at a first side surface 614 of the upper portion 610, and a second opening at a second side surface 615 of the upper portion 610 opposite to the first side surface 614. The second opening at the second side surface 615 is extended through an entire thickness of the protruding portion 613 taken in the first direction D1. Similarly, the second opening at the first side surface 614 is extended through an entire thickness of the protruding portion 613 in a direction opposite to the first direction D1. Where the previous exemplary embodiment in FIGS. 1 to 8 includes edges of the first opening portions 611 spaced away from the first and second side surfaces 614 and 615 of the connector 600, the illustrated exemplary embodiment includes the first opening portions 611 extended completely through the first and second side surfaces 614 and 615 of the connector 602.

The first and second light source modules 410 and 420 are inserted through the first and second side surfaces 614 and 615 of the connector 602 in a horizontal direction. In one exemplary embodiment, for example, the first light source module 410 is inserted into the connector 602 in the first direction D1. The second light source module 410 is inserted into the connector 602 in a direction opposite to the first direction D1. The first light source module 410 and the second light source module 420 are slidably disposed with respect to facing surfaces of the first opening portion 611, such that the first light source module 410 and the second light source module 420 are retained between the facing surfaces of the first opening portion 611.

As shown in figures, the first and second opening portions 611 and 612 may be extended to an upper surface of the upper portion 610. In an alternative exemplary embodiment, the first and second light source modules 410 and 420 are inserted through the upper surface of the connector 602 in a vertical direction. That is, the first and second light source modules 410 and 420 are inserted into the connector 602 in the third direction D3. Again, the first light source module 410 and the second light source module 420 are slidably disposed with respect to facing surfaces of the first opening portion 611, such that the first light source module 410 and the second light source module 420 are retained between the facing surfaces of the first opening portion 611.

The lower portion 620 of the body portion includes a fixing element 640 extended from a side surface of the lower portion 620. The fixing element 640 may be protruded from the side surface of the lower portion 620.

Figure 16:
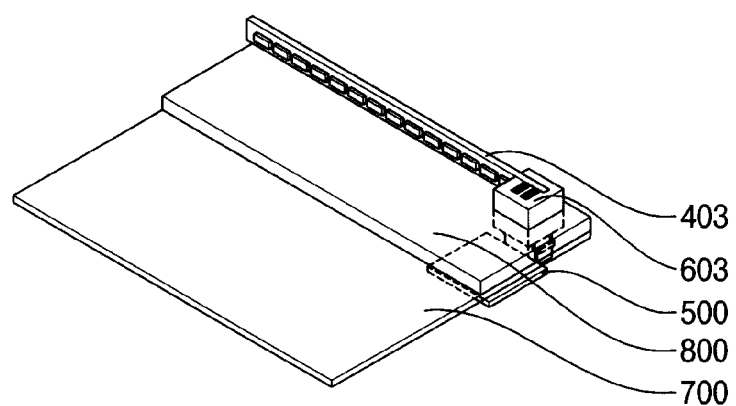
FIG. 16 is a perspective view illustrating still another exemplary embodiment of a backlight assembly according to the present invention.

FIG. 16 is a perspective view illustrating still another exemplary embodiment of a backlight assembly according to the present invention.

A connector and a backlight assembly according to the illustrated exemplary embodiment are substantially the same as the connector and the backlight assembly of the previous exemplary embodiment explained referring to FIGS. 12 to 15 except for a shape of a light source module part 403, position and shape of a connector 603. Thus, the same reference numerals will be used to refer to the same or like parts as those described in the previous exemplary embodiment of FIGS. 12 to 15 and any repetitive explanation concerning the above elements will be omitted.

Referring to FIGS. 1 and 16, the backlight assembly includes the light guide plate 300, the light source module part 403, the light source driver 500, the connector 603 and the bottom chassis 700.

The light guide plate 300 includes the first side surface 310 corresponding to a long side of the display panel 100, the second side surface 320 opposite to the first side surface 310, the third side surface 330 corresponding to a short side of the display panel 100 and the fourth side surface 340 opposite to the third side surface.

The light source module part 403 is adjacent to the first side surface 310 of the light guide plate 300. The light source module part 403 includes a single light source module. As shown in figures, the light source module part 403 includes only a first light source module 410. The first light source module 410 may have a length substantially the same as a length of a first side of the light guide plate 300 adjacent to the first side surface 310. The light source module part 403 is explained in detail referring to FIG. 17.

The connector 603 respectively directly receives the light source module part 403 and the light source driver 500 to electrically connect the light source module part 403 to the light source driver 500.

The connector 603 is disposed in an area corresponding to the light source terminal portion of the light source module part 403. As shown in figures, the light source terminal portion may be disposed adjacent to an end portion of the first side surface 310 of the light guide plate 300. The connector 603 is explained in detail referring to FIG. 18.

The bottom chassis 700 is disposed under the light guide plate 300 to receive the display panel 100, the light adjusting part 200, and the light guide plate 300. The bottom chassis 700 includes the bottom plate 710 and the plurality of side walls 720 extended from the bottom plate 710. In FIG. 16, the side walls 720 are omitted for convenience of explanation.

The bottom chassis 700 is combined with the connector 603. An opening 730 is extended through the bottom plate 710 of the bottom chassis 700 in an area at which the connector 603 is combined.

Figure 17:
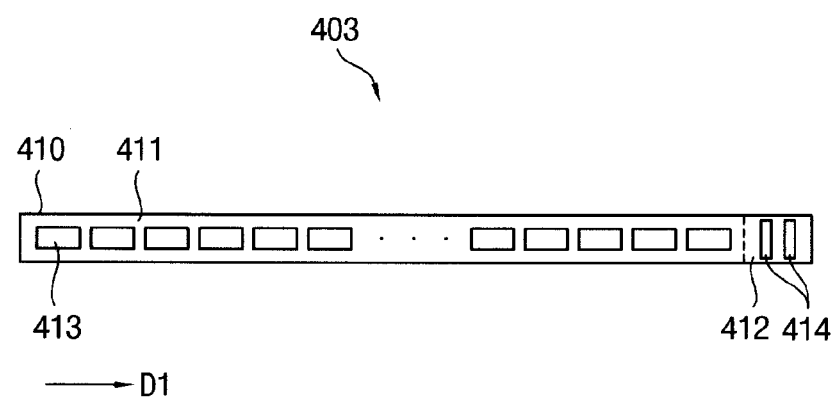
FIG. 17 is a plan view illustrating a light source module part of FIG. 16.

FIG. 17 is a plan view illustrating the light source module part 403 of FIG. 16.

Referring to FIG. 17, the light source module part 403 includes the light source substrate and the plurality of light emitting diodes. The light source substrate includes the light source portion, on which the light emitting diodes are disposed, and the light source terminal portion extended from the light source portion. The input terminal for driving the light emitting diodes is disposed on the light source terminal portion.

In the illustrated exemplary embodiment, the light source module part 403 includes only the first light source module 410. A first light source substrate of the first light source module 410 includes the first light source portion 411, on which light emitting diodes 413 are disposed, and the first light source terminal portion 412 extended from the first light source portion 411, on which an input terminal 414 for driving the light emitting diodes 413 is disposed. The first light source portion 411 is extended in a first direction D1. The first light source terminal portion 412 is extended from an end portion of the first light source portion 411 in the first direction D1.

Figure 18:
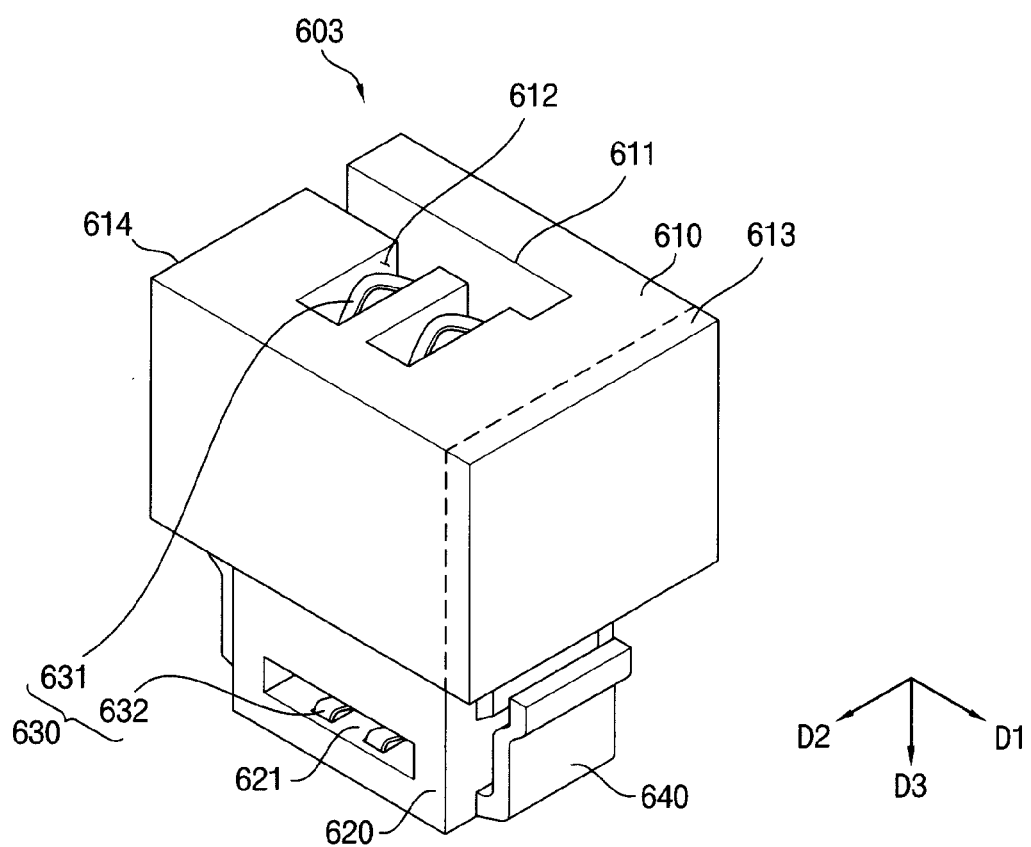
FIG. 18 is a perspective view illustrating a connector of FIG. 16.

FIG. 18 is a perspective view illustrating the connector 603 of FIG. 16.

Referring to FIGS. 16 and 18, the connector 603 includes the body portion and the terminal portion 630.

The first opening portion 611 receiving the light source module part 403 and the second opening portion 621 receiving the light source driver 500 are at the body portion. Specifically, the first light source terminal portion 412 and the second light source terminal portion 422 are received in the respective first opening portion 611 of the connector 602. The terminal portion 630 includes the first terminal 631 disposed in the first opening portion 611, and the second terminal 632 connected to the first terminal 631 and disposed in the second opening portion 621. The first light source terminal portion 412 and the second light source terminal portion 422 of the light source module part 402 may be physically and electrically connected to first terminals 631 within the first opening portion 611 of the connector 602.

The terminal opening portion 612 may be further at the upper portion 610 of the body portion in which is inserted the first terminal 631. The first opening portion 611 may have a rectangular shape profile in a plan view of which a longitudinal side is extended in the first direction D1. The first opening portion 611 may also have a rectangular shape profile in a cross-sectional view of which a longitudinal side is extended through a side surface of the upper portion 610 of the body portion. In the illustrated exemplary embodiment, the first opening portion 611 includes a single continuous opening. The first continuous opening portion 611 includes a first opening at the first side surface 614 of the upper portion 610. The first opening at the first side surface 614 is extended through the protruding portion 613 in a direction opposite to the first direction D1.

The light source module part 403 is inserted through the first side surface 614 of the connector 603 in a horizontal direction. In one exemplary embodiment, for example, the light source module part 403 is inserted into the connector 603 in the first direction D1. The first light source module 410 is slidably disposed with respect to facing surfaces of the first opening portion 611, such that the first light source module 410 is retained between the facing surfaces of the first opening portion 611.

As shown in figures, the first opening portion 611 may be extended to an upper surface of the upper portion 610. In an alternative exemplary embodiment, the light source module part 403 is inserted through the upper surface of the connector 603 in a vertical direction. That is, the light source module part 403 is inserted into the connector 603 in a third direction D3. Again, the first light source module 410 is slidably disposed with respect to facing surfaces of the first opening portion 611, such that the first light source module 410 is retained between the facing surfaces of the first opening portion 611.

The lower portion 620 of the body portion includes a fixing element 640 extended from a side surface of the lower portion 620. The fixing element 640 may be protruded from the side surface of the lower portion 620.

According to the present invention as explained above, the connector directly receives portions of both the light source module part and the light source driver so that connecting wirings may be omitted. Thus, a manufacturing cost may be decreased. Reliability of the backlight assembly may be improved. In addition, the light emitting diodes are electrically grounded through the light source substrate so that feedback wirings may be omitted.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims.

In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. The present invention is defined by the following claims, with equivalents of the claims to be included therein.

What is claimed is:

1. A connector for a light source module, comprising:
a body portion including:
a first opening portion configured to receive a portion of a light source substrate of the light source module, wherein a light source is disposed on the light source substrate, and
a second opening portion configured to receive a portion of a light source driver which drives the light source module; and
a terminal portion including a first terminal in the first opening portion, and a second terminal connected to the first terminal and in the second opening portion,
wherein the light source substrate and the light source driver received in the first and second opening portions and connected to the first and second terminals, respectively, protrude from the first and second opening portions in different directions.

2. The connector of claim 1, wherein
the first opening portion extends through an upper surface of the body portion, and
the second opening portion extends through a side surface of the body portion substantially perpendicular to the upper surface of the body portion.

3. The connector of claim 2, wherein the first opening portion includes a first opening and a second opening.

4. The connector of claim 1, wherein
the first opening portion extends through a first side surface of the body portion, and
the second opening portion extends through a second side surface of the body portion substantially perpendicular to the first side surface through which the first opening portion extends.

5. The connector of claim 4, wherein the first opening portion includes:
a first opening extended through the first side surface of the body portion, and
a second opening extended through a third side surface of the body portion opposite to the first side surface.

6. The connector of claim 5, wherein the first and second openings are each extended through an upper surface of the body portion.

7. The connector of claim 1, wherein an upper portion of the body portion has a width greater than a width of a lower portion of the body portion.

8. The connector of claim 1, wherein the lower portion of the body portion includes a fixing element protruded from a side surface of the lower portion.

9. The connector of claim 1, wherein
the first terminal of the terminal portion contacts a first surface of the light source module, and
the second terminal of the terminal portion contacts first and second surfaces of the light source driver, the second surface being opposite to the first surface.

10. A backlight assembly comprising:
a light source module part including a light source substrate, and a plurality of light emitting diodes on the light source substrate;
a bottom chassis under the light source module part, wherein the bottom chassis receives the light source module part;
a light source driver facing a bottom surface of the bottom chassis, wherein the light source driver drives the light source module part; and
a connector including:
a body portion including a first opening portion configured to receive a portion of the light source substrate of the light source module part, and a second opening portion configured to receive a portion of the light source driver, and
a terminal portion including a first terminal in the first opening portion, and a second terminal connected to the first terminal and in the second opening portion,
wherein the light source substrate and the light source driver received in the first and second opening portions and connected to the first and second terminals, respectively, protrude from the first and second opening portions in different directions.

11. The backlight assembly of claim 10, wherein the light source substrate comprises:
a light source portion on which the light emitting diodes are disposed; and
a light source terminal portion extended directly from the light source portion and on which an input terminal is disposed.

12. The backlight assembly of claim 11, wherein
the light source portion of the light source substrate is extended in a first direction, and the light source terminal portion of the light source substrate is extended from an end portion of the light source portion in a second direction crossing the first direction,
the first opening portion of the connector is extended through an upper surface of the body portion, wherein the first opening portion receives a portion of the light source terminal portion, and
the second opening portion of the connector is extended through a side surface of the body portion substantially perpendicular to the upper surface of the body portion, wherein the second opening portion receives the portion of the light source driver.

13. The backlight assembly of claim 12,
wherein the light source module part includes:
a first light source module including a first light source terminal portion, and
a second light source module including a second light source terminal portion, and
wherein the first opening portion of the connector includes:
a first opening receiving the first light source terminal portion, and
a second opening receiving the second light source terminal portion.

14. The backlight assembly of claim 11, wherein
the light source portion of the light source substrate is extended in a first direction, and the light source terminal portion of the light source substrate is extended from an end portion of the light source portion in the first direction,
the first opening portion of the connector is extended through a first side surface of the body portion, wherein the first opening portion receives the light source terminal portion, and
the second opening portion extends through at a second side surface of the body portion substantially perpendicular to the first side surface through which the first opening portion extends, wherein the second opening portion receives the portion of the light source driver.

15. The backlight assembly of claim 14,
wherein the light source module part includes:
a first light source module including a first light source terminal portion, and
a second light source module including a second light source terminal portion, and
wherein the first opening portion of the connector includes:
a first opening extended through the first side surface of the body portion, wherein the first opening receives the first light source terminal portion, and
a second opening extended through a third side surface of the body portion opposite to the first side surface of the body portion, wherein the second opening receives the second light source terminal portion.

16. The backlight assembly of claim 15, wherein the first and second openings are extended through an upper surface of the body portion.

17. The backlight assembly of claim 11, wherein the light source module part further includes a light emitting diode string including the light emitting diodes connected to each other in series.

18. The backlight assembly of claim 17, wherein a positive electrode anode of a first light emitting diode of the light emitting diode string, which is the closest to the light source terminal portion, is connected to the input terminal of the light source module part.

19. The backlight assembly of claim 18, wherein the light source module part further includes a plurality of the light source emitting diode strings.

20. The backlight assembly of claim 19, wherein
the light source driver includes a balancing circuit adjusting a current flow through the light emitting diodes to have a uniform level, and
the balancing circuit is connected to the positive electrode anode of the first light emitting diode through the connector.

21. The backlight assembly of claim 20, wherein a negative electrode cathode of a second light emitting diode of the light emitting diode string, which is the farthest from the light source terminal portion, is connected to the light source substrate and electrically grounded.

22. The backlight assembly of claim 10, wherein
the bottom chassis includes an opening extended through a bottom plate of the bottom chassis, the body portion of the connector received in the opening,
an upper portion of the body portion of the connector is disposed over the bottom plate of the bottom chassis, and
a lower portion of the body portion is disposed under the bottom plate of the bottom chassis.

23. The backlight assembly of claim 22, wherein
the upper portion of the body portion includes a protruding portion extending further than a side surface of the lower portion of the body portion, and
a lower surface of the protruding portion contacts an upper surface of the bottom plate of the bottom chassis.

24. The backlight assembly of claim 23, wherein
the lower portion of the body portion includes a fixing element protruded from the side surface of the lower portion, and
an upper surface of the fixing element contacts a lower surface of the bottom plate of the bottom chassis.

25. The backlight assembly of claim 10, wherein
the first terminal of the terminal portion of the connector contacts a first surface of the light source module part, and
the second terminal of the terminal portion of the connector contacts both first and second surfaces of the light source driver, the second surface being opposite to the first surface.

26. The backlight assembly of claim 10, further comprising a light guide plate,
wherein the light source module part is extended along a first side surface of the light guide plate.

27. The backlight assembly of claim 26, wherein the connector is disposed adjacent to a central portion of the first side surface of the light guide plate.

28. The backlight assembly of claim 26, wherein the connector is disposed adjacent to an end portion of the first side surface of the light guide plate.

29. The backlight assembly of claim 10, further comprising a heat sink plate disposed on the bottom chassis, wherein the heat sink plate absorbs a heat generated from the light source module part.

30. The backlight assembly of claim 29, wherein an upper surface of the heat sink plate is coplanar with an upper surface of the connector.

* * * * *